(12) United States Patent
Chen

(10) Patent No.: US 7,327,069 B2
(45) Date of Patent: Feb. 5, 2008

(54) SURFACE ACOUSTIC WAVE DEVICE AND METHOD FOR MAKING SAME AND MOBILE PHONE HAVING SAME

(75) Inventor: Ga-Lane Chen, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 29 days.

(21) Appl. No.: 11/306,495

(22) Filed: Dec. 29, 2005

(65) Prior Publication Data

US 2006/0197408 A1  Sep. 7, 2006

(30) Foreign Application Priority Data

Mar. 4, 2005  (CN) ................. 2005 1 0033495

(51) Int. Cl.
*H03H 9/25* (2006.01)
(52) U.S. Cl. ................................. 310/313 R
(58) Field of Classification Search ............ 310/313 R, 310/313 A–313 D
See application file for complete search history.

(56) References Cited

U.S. PATENT DOCUMENTS

| 3,996,535 | A | * | 12/1976 | Turski | ............ 333/142 |
|---|---|---|---|---|---|
| 4,562,371 | A | * | 12/1985 | Asai et al. | ............ 310/313 A |
| 4,567,393 | A | * | 1/1986 | Asai et al. | ............ 310/313 A |
| 5,998,907 | A | * | 12/1999 | Taguchi et al. | ......... 310/313 R |
| 6,127,768 | A | * | 10/2000 | Stoner et al. | ........... 310/313 A |
| 6,589,362 | B2 | * | 7/2003 | Haga | .......................... 148/33.4 |
| 2002/0027485 | A1 | * | 3/2002 | Shin | ............................ 333/193 |
| 2003/0011281 | A1 | * | 1/2003 | Itakura et al. | .......... 310/313 R |
| 2005/0093402 | A1 | * | 5/2005 | Ikeda et al. | .................. 310/328 |
| 2006/0174823 | A1 | * | 8/2006 | Sung | ............................ 117/84 |

FOREIGN PATENT DOCUMENTS

| JP | 58-56513 | * | 4/1983 |
|---|---|---|---|
| JP | 60-21862 | * | 2/1985 |
| JP | 61-16610 | * | 1/1986 |
| JP | 11-14110 | * | 5/1989 |
| JP | 2-290316 | * | 11/1990 |
| JP | 63-018708 | * | 1/1998 |
| JP | 10-209801 | * | 8/1998 |

* cited by examiner

*Primary Examiner*—Thomas M. Dougherty
(74) *Attorney, Agent, or Firm*—Winston Hsu

(57) ABSTRACT

A surface acoustic wave (SAW) device includes a silicon substrate, a piezoelectric layer on the substrate and two generally comb-shaped electrodes. The thickness of the piezoelectric layer is preferably configured to be in the range from about 0.05 μm to about 2 μm, and the grain size of the piezoelectric layer is preferably configured to be in the range from about 1 nm to about 50 nm. A mobile phone assembled at least two SAW devices therein, and a method for manufacturing a SAW device, are also provided.

10 Claims, 3 Drawing Sheets

SURFACE ACOUSTIC WAVE DEVICE AND METHOD FOR MAKING SAME AND MOBILE PHONE HAVING SAME

FIELD OF THE INVENTION

The invention relates to surface acoustic wave (SAW) devices, and particularly to a SAW device for use in multi-band mobile communication devices, such as mobile phones. The invention also relates to a method of manufacturing the SAW device and a mobile phone having the SAW device.

DESCRIPTION OF RELATED ART

Conventional mobile phones are generally classified into single band mobile phones, dual-band mobile phones, and tri-band mobile phones according to the transmission frequency of transmitters/receivers incorporated therein. For example, Nokia model No. 5110 manufactured by Nokia in 1998 is a single band 0.9 GHz mobile phone. Nokia model No. 8210 manufactured by Nokia in 2000 is a dual-band 0.9 GHz/1.8 GHz mobile phone. Nokia model No. 7210 manufactured by Nokia in 2002 is a tri-band 0.9 GHz/1.8 GHz/1.9 GHz mobile phone. However, a signal-to-noise ratio of a conventional RF transmitter/receiver generally tends to be decayed. Therefore, surface acoustic wave (SAW) devices, such as SAW filters, are prevalently utilized instead of the RF transmitters and receivers in mobile phones.

In the cases of a mobile phone having a SAW device, interconversion between electrical signals and audio signals is performed by the SAW device. The SAW is a mechanical wave, which is transmitted via surface portions of a piezoelectric crystal at a speed of one-millionth of that of the electromagnetic wave. Therefore, the signal-to-noise ratio of the SAW can hardly be changed. A typical SAW device has inter-digital transducers (IDTs) and a reflection coupler, which are formed on a piezoelectric substrate. In use, an input IDT converts electrical signals into audio signals, and an output IDT converts audio signals into electrical signals.

With the development of the electronic technology, high-frequency mobile phones have been used in some countries. However, most of conventional SAW device cannot meet the requirement of high frequency. Thus, a SAW device that can operate at high frequencies is desired.

SUMMARY OF THE INVENTION

In one embodiment, a surface acoustic wave (SAW) device includes a silicon substrate, a piezoelectric layer formed on a surface of the substrate, and two comb-shaped electrodes. The thickness of the piezoelectric layer is configured to be in the range from about 0.05 μm to about 2 μm. The electrodes are formed on the piezoelectric layer, and have a plurality of comb-shaped teeth with the comb-shaped teeth being interleaved with one another.

Method of manufacturing the above SAW device includes steps of: (a) providing a silicon substrate; (b) forming a piezoelectric layer on the substrate by a sputtering process, with the thickness of the piezoelectric layer in the range from about 0.05 μm to about 2 μm and the grain size of the piezoelectric layer in the range from about 1 nm to about 50 nm, a sputtering gas being a combination of an argon (Ar) gas and an oxygen gas; (c) applying photo-resist on a top of the piezoelectric layer by a spin-coating process; (d) placing a photomask with a given pattern on the photo-resist, and developing the photo-resist thereby obtaining a photo-resist layer formed on the piezoelectric layer with two comb-shaped portions of the photo-resist layer being removed; (e) forming a metal film on the treated silicon substrate by a sputtering process; and (f) moving the remaining photo-resist and portions of the metal film on the remaining photo-resist, thereby obtaining two comb-shaped electrodes on the piezoelectric layer.

Other advantages and novel features of the present method will become more apparent from the following detailed description of preferred embodiments when taken in conjunction with the accompanying drawings.

BRIEF DESCRIPTION OF THE DRAWINGS

Many aspects of the present surface acoustic wave (SAW) device and method of making such can be better understood with reference to the following drawings. The components in the drawings are not necessarily to scale, the emphasis instead being placed upon clearly illustrating the principles of the present SAW device.

Figure 1:
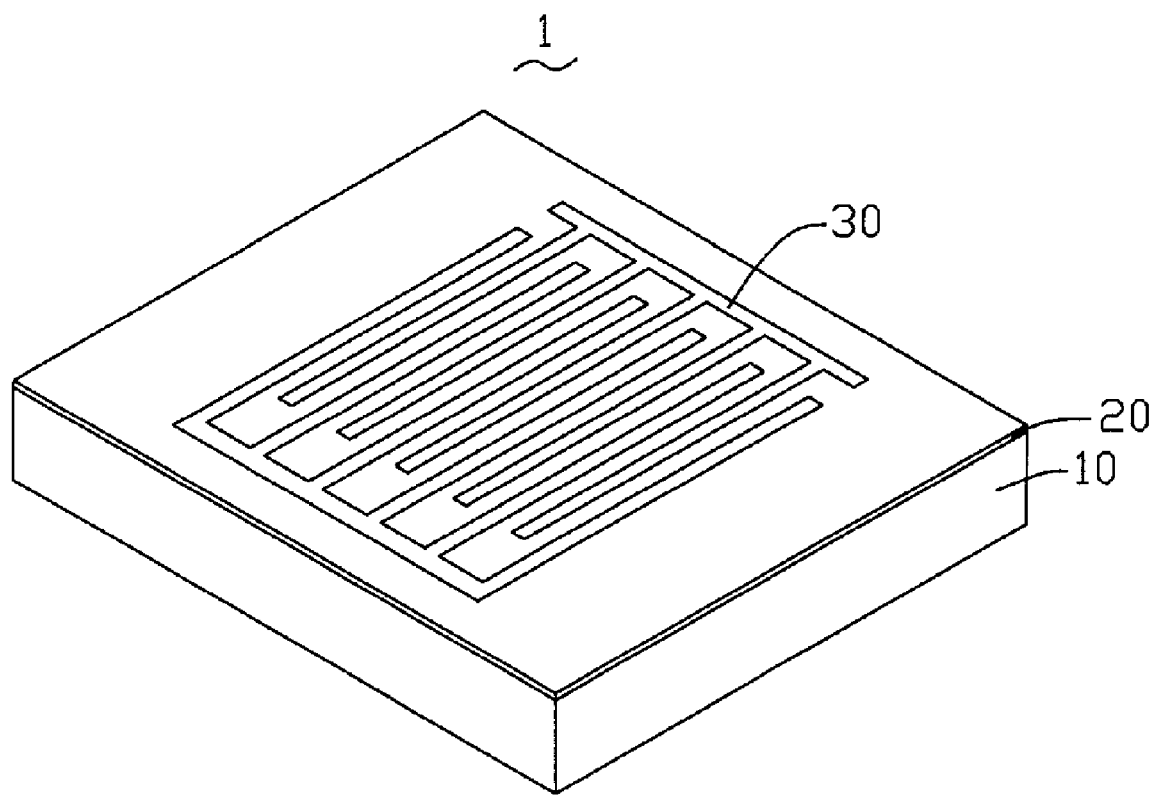
FIG. 1 is an isometric view of a surface acoustic wave (SAW) device in accordance with a preferred embodiment of the present device.

Corresponding reference characters indicate corresponding parts throughout the several views. The exemplifications set out herein illustrate at least one preferred embodiment of the present SAW device and method for making such, in one form, and such exemplifications are not to be construed as limiting the scope of the invention in any manner.

DETAILED DESCRIPTION

Reference will now be made to the drawings to describe embodiments of the present device and method for making such in detail.

Figure 2:
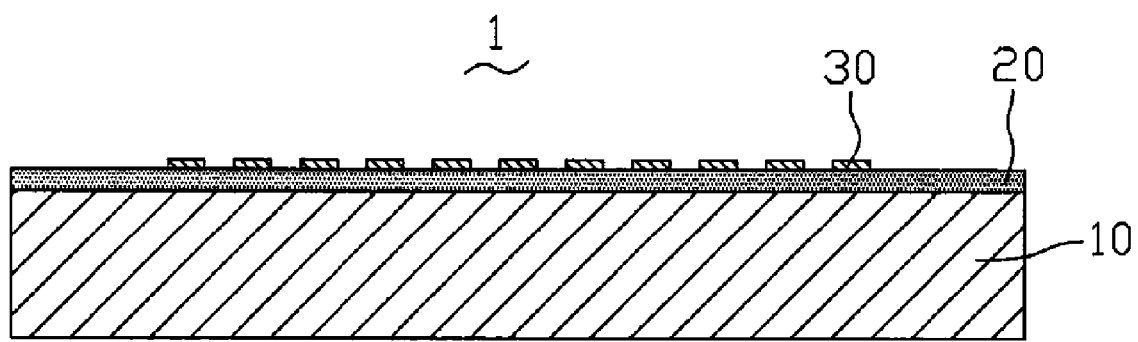
FIG. 2 is a schematic, cross-sectional side view of the SAW device of FIG. 1.

Referring to FIGS. 1 and 2, a SAW device 1 is illustrated in accordance with an exemplary embodiment of the present device. The SAW device 1 is generally used in mobile communication devices, such as mobile phones. The SAW device 1 comprises a silicon substrate 10, a piezoelectric layer 20 disposed on an upper surface of the substrate 10, and two electrodes 30. The piezoelectric layer 20 is made from a material selected from the group consisting of ZnOx, LiNbOx, LiTiOx, and LiTaOx. A thickness of the piezoelectric layer 20 is in the range from about 0.05 μm to about 2 μm. The electrodes 30 are comb-shaped electrodes each having a plurality of comb-shaped teeth (not labeled). The electrodes 30 are disposed on the piezoelectric layer 20 with the teeth thereof being interleaved with one another. The electrodes 30 serve as input and output interdigital transducers (IDTs), respectively.

It is recognized that the higher the frequency band associated with the SAW device is, the thinner the thickness of the piezoelectric layer is. In general, the thickness of the piezoelectric layer 20 can be configured to be in the range from about 0.05 μm to about 2 μm. For example, if the piezoelectric layer 20 that is formed of ZnOx is used in a 0.9 GHz SAW device 1, the thickness of the piezoelectric layer 20 is preferably configured in the range from about 1.5 μm to about 2 μm. If the piezoelectric layer 20 that is formed of ZnOx is used in a 1.8 GHz SAW device 1, the thickness of the piezoelectric layer 20 is preferably configured to be in the range from about 0.7 μm to about 1 μm. If the piezoelectric layer 20 that is formed of ZnOx is used in a 2.4 GHz SAW device 1, the thickness of the piezoelectric layer 20 is preferably configured to be in the range from about 0.4 μm to about 0.6 μm. If the piezoelectric layer 20 that is formed of ZnOx is used in a 5 GHz SAW device 1, the thickness of the piezoelectric layer 20 is preferably configured to be in the range from about 0.2 μm to about 0.3 μm. If the piezoelectric layer 20 that is formed of ZnOx is used in a 9 GHz SAW device 1, the thickness of the piezoelectric layer 20 is preferably configured to be in the range from about 0.1 μm to about 0.2 μm. If the piezoelectric layer 20 that is formed of ZnOx is used in an 18 GHz SAW device 1, and the thickness of the piezoelectric layer 20 is preferably configured to be in the range from about 0.05 μm to about 0.08 μm.

Figure 3:
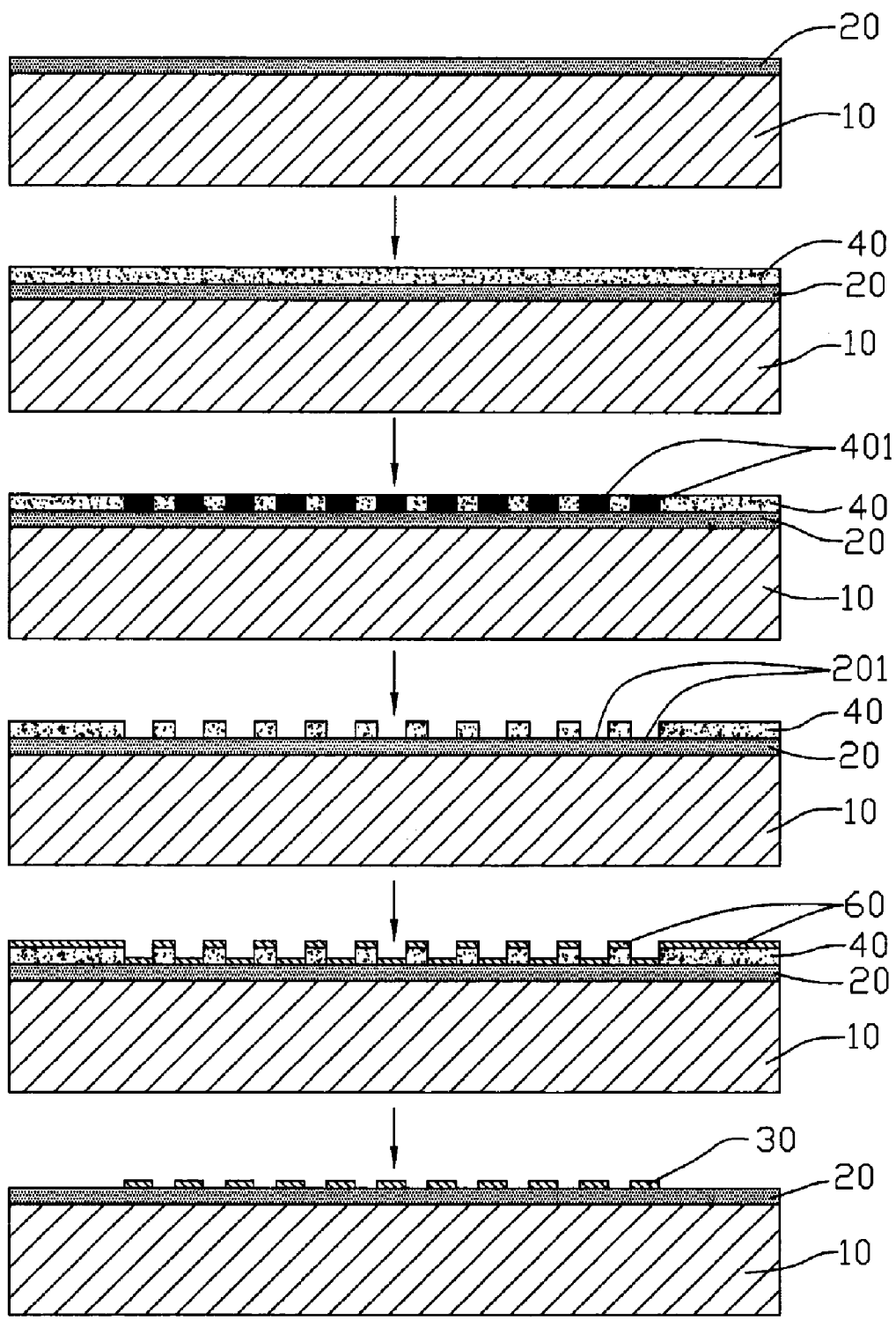
FIG. 3 is a schematic, cross-sectional view showing successive steps of a method for manufacturing the SAW device of FIG. 1.

Referring to FIG. 3, a method for manufacturing a SAW device generally includes the steps of: (a) placing a silicon substrate 10 in a vacuum chamber (not shown); (b) forming a piezoelectric layer 20 having a thickness in the range from about 0.02 μm to about 5 μm on an upper surface of the substrate 10 by a DC reactive sputtering process or an RF sputtering process with a sputtering target being made of a material selected from the group consisting of ZnOx, LiNbOx, LiTiOx, and LiTaOx, a sputtering gas being a combination of an argon (Ar) gas and an oxygen gas; (c) applying a photo-resist 40 on the piezoelectric layer 20 by a spin-coating process; (d) placing a photomask (not shown in FIG. 3) with a given pattern on the photo-resist 40, applying a radiation of a laser or UV (Ultraviolet) light to the exposed photo-resist 401; (e) removing the photomask; (f) developing the exposed photo-resist 401 to form a photo-resist layer formed on the piezoelectric layer 201 with two comb-shaped portions of the photo-resist layer being removed; (g) forming a metal film 60 on the treated silicon substrate 10 by a sputtering process, the metal being selected from one of Au, Al, Cu, and Ag; and (h) removing the remaining photo-resist 40 and portions of the metal film 60 on the remaining photo-resist 40, thereby obtaining two comb-shaped metal film portions 60 as comb-shaped electrodes 30 on the piezoelectric layer 201.

Advantageously, in step (ii), a grain size of the piezoelectric layer 20 is configured to be in the range from 1 nm to 50 nm during forming the piezoelectric layer 20. For example, if a transmission frequency of the SAW device is in the 0.9 GHz band, the grain size of the piezoelectric layer 20 formed of ZnOx is preferably configured to be in the range from about 20 nm to about 50 nm, and the thickness thereof is preferably configured to be in the range from about 1.5 μm to about 2 μm. If a transmission frequency of the SAW device is in the 1.8 GHz band, the grain size of the piezoelectric layer 20 is preferably configured to be in the range from about 10 nm to about 20 nm, and the thickness thereof is preferably configured to be in the range from about 0.7 μm to about 1 μm. If a transmission frequency of the SAW device is in the 2.4 GHz band, the grain size of the piezoelectric layer 20 formed of ZnOx is preferably configured to be in the range from about 5 nm to about 10 nm, and the thickness thereof is preferably configured to be in the range from about 0.4 μm to about 0.6 μm. If a transmission frequency of the SAW device is in the 5 GHz band, the grain size of the piezoelectric layer 20 formed of ZnOx is preferably configured to be in the range from about 3 nm to about 5 nm, and the thickness thereof is preferably configured to be in the range from about 0.2 μm to about 0.3 μm. If a transmission frequency of the SAW device is in the 9 GHz band, the grain size of the piezoelectric layer 20 formed of ZnOx is preferably configured to be in the range from about 2 nm-3 nm, and the thickness thereof is configured to be in the range from about 0.1 μm-0.2 μm. If a transmission frequency of the SAW device is in the 18 GHz band, the grain size of the piezoelectric layer 20 formed of ZnOx is preferably configured to be in the range from about 1 nm-2 nm, and the thickness thereof is preferably configured to be in the range from about 0.05 μm-0.08 μm.

The present SAW device may be implemented into a mobile phone and functions as a SAW filter. In an exemplary embodiment, a multi-band mobile phone generally comprises at least two surface acoustic wave (SAW) devices as filters. The SAW devices each comprises a silicon substrate, a piezoelectric layer formed on the silicon substrate, and two comb-shaped electrodes formed on the piezoelectric layer. The thickness of the piezoelectric layer is preferably configured to be in the range from about 0.05 μm to about 2 μm. The electrodes each have a plurality of comb-shaped teeth with the comb-shaped teeth being interleaved with one another. The electrodes function as input/output inter digital transducers (IDTs). The multi-band mobile phone can operate at a transmission speed of 0.9 GHz, 1.8 GHz, 2.4 GHz, 5 GHz, 9 GHz or 18 GHz.

Finally, it is to be understood that the above-described embodiment are intended to illustrate rather than limit the invention. Variations may be made to the embodiments without departing from the spirit of the invention as claimed. The above-described embodiment illustrates the scope of the invention but do not restrict the scope of the invention.

What is claimed is:

1. A surface acoustic wave (SAW) device comprising:
   a silicon substrate;
   a piezoelectric layer formed on the silicon substrate, the thickness of the piezoelectric layer being configured to be in the range from about 0.05 μm to about 2 μm, the grain size of the piezoelectric layer being configured to be in the approximate range from 1 nm to 50 nm; and
   two comb-shaped electrodes formed on the piezoelectric layer, the electrodes each having a plurality of comb-shaped teeth with the comb-shaped teeth being interleaved with one another.

2. The SAW device as claimed in claim 1, wherein the piezoelectric layer is made from ZnOx.

3. The SAW device as claimed in claim 2, wherein the thickness of the piezoelectric layer is configured to be in the range from about 1.5 μm-2 μm and the grain size of the piezoelectric layer is configured to be in the range from about 20 nm to about 50 nm.

4. The SAW device as claimed in claim 2, wherein the thickness of the piezoelectric layer is configured to be in the range from about 0.7 μm-1 μm and the grain size of the piezoelectric layer is configured to be in the range from about 10 nm to 20 nm.

5. The SAW device as claimed in claim 2, wherein the thickness of the piezoelectric layer is configured to be in the range from about 0.4 μm-0.6 μm and the grain size of the piezoelectric layer is configured to be in the range from about 5 nm to about 10 nm.

6. The SAW device as claimed in claim 2, wherein the thickness of the piezoelectric layer is configured to be in the range from about 0.2 μm-0.3 μm and the grain size of the piezoelectric layer is configured to be in the range from about 3 nm to about 5 nm.

7. The SAW device as claimed in claim 2, wherein the thickness of the piezoelectric layer is configured to be in the range from about 0.1 μm-0.2 μm and the grain size of the piezoelectric layer is configured to be in the range from about 2 nm to about 3 nm.

8. The SAW device as claimed in claim 2, wherein the thickness of the piezoelectric layer is configured to be in the range from about 0.05 μm-0.08 μm and the grain size of the piezoelectric layer is configured to be in the range from about 1 nm to about 2 nm.

9. The SAW device as claimed in claim 1, wherein the piezoelectric layer is made from LiTaOx.

10. The SAW device as claimed in claim 1, wherein the piezoelectric layer is made from LiTiOx.

* * * * *